(12) United States Patent
Bedjaoui et al.

(10) Patent No.: US 9,419,254 B2
(45) Date of Patent: Aug. 16, 2016

(54) LITHIUM MICROBATTERY PROTECTED BY A COVER

(71) Applicant: COMMISSARIAT A L'ENERGIE ATOMIQUE ET AUX ENERGIES ALTERNATIVES, Paris (FR)

(72) Inventors: Messaoud Bedjaoui, Voreppe (FR); Hermance Desre, Grenoble (FR); Aboubakr Ennajdaoui, Saint Martin le Vinoux (FR); Sylvain Poulet, Saint Victor de Cessieu (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 57 days.

(21) Appl. No.: 14/446,904

(22) Filed: Jul. 30, 2014

(65) Prior Publication Data

US 2015/0037660 A1    Feb. 5, 2015

(30) Foreign Application Priority Data

Jul. 30, 2013    (FR) ...................... 13 01831

(51) Int. Cl.
*H01M 10/052*        (2010.01)
*H01M 2/02*          (2006.01)
*B32B 37/12*         (2006.01)
(Continued)

(52) U.S. Cl.
CPC ............. *H01M 2/0207* (2013.01); *B32B 37/12* (2013.01); *B32B 37/24* (2013.01); *B32B 38/0008* (2013.01); *B32B 38/0036* (2013.01); *C23C 16/06* (2013.01); *C23C 16/45553* (2013.01); *C23C 16/45555* (2013.01); *H01M 2/0212* (2013.01); *H01M 2/0404* (2013.01); *H01M 2/0469* (2013.01); *H01M 2/08* (2013.01); *H01M 10/04* (2013.01); *H01M 10/052* (2013.01); *H01M 10/0585* (2013.01); *H01M 10/4235* (2013.01); *B32B 2037/1253* (2013.01); *B32B 2037/243* (2013.01); *B32B 2038/0076* (2013.01); *B32B 2307/202* (2013.01); *B32B 2310/0831* (2013.01); *B32B 2398/00* (2013.01); *B32B 2457/10* (2013.01); *H01M 4/382* (2013.01); *H01M 10/0436* (2013.01); *H01M 10/0525* (2013.01); *Y02E 60/122* (2013.01); *Y10T 156/10* (2015.01)

(58) Field of Classification Search
CPC ............................. H01M 10/052; H01M 6/40
See application file for complete search history.

(56) References Cited

U.S. PATENT DOCUMENTS

2005/0147877 A1*  7/2005  Tarnowski .......... H01M 2/0207
                                                       429/162
2006/0216589 A1   9/2006  Krasnov et al.
(Continued)

FOREIGN PATENT DOCUMENTS

EP       2 262 036 A1    12/2010
EP       2 432 065 A1     3/2012
WO       WO 01/89006 A1  11/2001

*Primary Examiner* — Stewart Fraser
*Assistant Examiner* — Olatunji Godo
(74) *Attorney, Agent, or Firm* — Oliff PLC

(57) ABSTRACT

A lithium microbattery comprises a stack of active layers containing lithium and a protective cover covering the stack of active layers. The protective cover is fixed to the stack of active layers by means of a layer of glue.
A buffer structure comprising at least one alumina layer is arranged between the stack of active layers and the layer of glue, the buffer structure being in contact with said stack of active layers.

16 Claims, 4 Drawing Sheets

(51) Int. Cl.
*B32B 37/24* (2006.01)
*B32B 38/00* (2006.01)
*C23C 16/06* (2006.01)
*C23C 16/455* (2006.01)
*H01M 2/08* (2006.01)
*H01M 10/04* (2006.01)
*H01M 10/42* (2006.01)
*H01M 2/04* (2006.01)
*H01M 10/0585* (2010.01)
*H01M 10/0525* (2010.01)
*H01M 4/38* (2006.01)

(56) References Cited

U.S. PATENT DOCUMENTS

| | | | |
|---|---|---|---|
| 2010/0123993 A1* | 5/2010 | Laor | H01G 4/33 361/303 |
| 2010/0291431 A1 | 11/2010 | Shih et al. | |
| 2012/0070588 A1* | 3/2012 | Bedjaoui | H01M 2/021 427/510 |
| 2013/0164607 A1 | 6/2013 | Shih et al. | |

* cited by examiner

LITHIUM MICROBATTERY PROTECTED BY A COVER

BACKGROUND OF THE INVENTION

The invention relates to a lithium microbattery and more particularly to the encapsulation system which protects the active layers from the external environment.

STATE OF THE ART

A lithium microbattery conventionally comprises two electrodes (positive and negative) separated by an electrolyte. The positive electrode is formed from a material having a good ionic conductivity, for example titanium oxysulfide (TiOS). The electrolyte is an electric insulator having a high ionic conductivity such as lithium and phosphorus oxynitride (LiPON). Finally, the nature of the negative electrode varies according to the technology of the microbattery.

In microbatteries called "lithium-ion" microbatteries, the negative electrode is formed from a lithiated material, i.e. a material in which lithium ions are inserted. In "lithium-metal" microbatteries, the negative electrode is formed solely from lithium.

Materials containing lithium are very sensitive to air, and in particular to oxygen and moisture. To prevent them from oxidizing, they have to be covered by an inert and tight protective barrier. Mastering encapsulation is a factor of paramount importance which conditions the efficiency of the microbatteries in time.

The quality of an encapsulation system can be evaluated according to three criteria:
- the barrier level: the performances of the protective barrier are defined by the permeation rate of the oxidizing species. For lithium microbatteries, the barrier level sought for is generally situated between $10^{-4}$ and $10^{-5}$ g/m$^2$/day.
- the mechanical strength: the encapsulation system has to be able to accommodate the variations of the volume of the microbattery, during charge and discharge cycles. If it doesn't, the expansion or contraction of the microbattery can lead to mechanical damage in the electrodes, resulting in an irreversible decrease of the electric capacitance.
- the physical-chemical compatibility: the encapsulation system has to be chemically compatible with the materials containing lithium and fabrication of the latter must not damage the active layers.

The encapsulation solutions of a lithium microbattery can be divided into two categories: encapsulation in thin layers and encapsulation by added-on element.

Encapsulation solutions by added-on element consist in sticking a cover, for example made from glass or laminated polymer material, above the active layers of the microbattery. This type of encapsulation complies with the above-mentioned three criteria, the barrier level being particularly high. On account of its thickness, the permeation rate of the cover with respect to the oxidizing species is in fact lower than that of a stack of thin layers made from polymer, metal and/or ceramic.

FIG. 1 schematically represents a lithium microbattery provided with an encapsulation system by added-on element, as described in the document US2006/0216589.

The microbattery comprises a stack 2 of active layers formed on a substrate 4. Stack 2 is contained in a cavity 6 delineated by substrate 4 and by a cover 8 facing the substrate. A bead of epoxy resin glue 10 secures cover 8 to substrate 4 around stack 2.

In this configuration, substrate 6 and cover 8 form the main surfaces of the microbattery, respectively the bottom and top surfaces. As they are impermeable to species oxidizing lithium, the surface protection of the microbattery is total. In order to simultaneously ensure securing of cover 8 on substrate 4 and protection of the sides of the microbattery, bead of glue 10 does however occupy a vast area around stack 2. A large surface of the substrate is thus dedicated to cavity 6 and to sealing bead 10, to the detriment of the useful surface of the microbattery.

SUMMARY OF THE INVENTION

It is observed that a requirement exists to provide a lithium microbattery of reduced dimensions, with an efficient and compact encapsulation device.

This requirement tends to be met by providing a lithium microbattery comprising a stack of active layers containing lithium and a protective cover covering the stack of active layers. The protective cover is fixed to the stack of active layers by means of a layer of glue. A buffer structure comprising at least an alumina buffer layer is arranged between the stack of active layers and the layer of glue. The buffer structure is in contact with said stack.

In a preferred embodiment, the alumina layer of the buffer structure is in contact with the layer of glue.

In a preferred embodiment, at least the alumina layer of the buffer structure totally covers the stack of active layers in order to efficiently protect the sides of the microbattery.

The stack advantageously comprises a metallic lithium electrode in contact with the buffer structure.

A method for fabricating such a microbattery is also provided. The method comprises deposition of a buffer structure comprising at least an alumina layer on a stack of active layers containing lithium, deposition of a layer of polymerizable material on the buffer structure, a step consisting in covering the stack of active layers and the polymerizable material layer by a protective cover and cross-linking of the polymerizable material to glue the cover onto the stack of active layers.

The alumina layer is preferably obtained by Atomic Layer Deposition (ALD). The alumina deposition on the stack of active layers is thus homogeneous and the layer obtained is impermeable to the chemical species which could oxidize the active layers.

Atomic Layer Deposition is advantageously performed from a first precursor containing aluminium and a second precursor containing water.

The first and second precursors are in particular used in successive manner, starting by the first precursor.

BRIEF DESCRIPTION OF THE DRAWINGS

Other advantages and features will become more clearly apparent from the following description of particular embodiments of the invention given for non-restrictive example purposes only and illustrated by means of the appended drawings, in which.

DESCRIPTION OF A PREFERRED EMBODIMENT OF THE INVENTION

In order to reduce the volume of an encapsulation system, one solution would consist in gluing the protective cover directly on the stack of active layers of the microbattery, rather than at its periphery. The glues commonly used for securing the cover are polymerizable materials. However, the lithium contained in the active layers inhibits polymerization of the glues. This solution is therefore not able to be envisaged unless a suitable buffer structure blocking diffusion of the lithium to the polymerizable material is provided.

After several tests, it was discovered that a buffer structure comprising at least one alumina layer performed this function perfectly.

What is meant by buffer structure is one or more layers of insulating materials able to block diffusion of the lithium to the polymerizable layer. These materials can be chosen in particular from the list comprising alumina, $SiO_2$, $Si_3N_4$, $SiO_xC_y$, $SiO_xN_y$, or a combination of these materials.

Furthermore, the buffer structure has to have surface properties enabling a good adhesion with the polymerizable material to obtain good securing of the cover.

Preferably, the buffer layer comprises at least one alumina layer designed to be in contact with said polymerizable layer in the buffer structure.

Finally, this buffer structure also has to have mechanical characteristics enabling variations of the volume of the stack to be absorbed and enabling a barrier to be formed against species liable to damage the lithium ($H_2O$, $O_2$, $N_2$).

For these tests, several samples were considered each comprising a buffer structure comprising at least a buffer layer. Each sample comprises a lithium layer covered by the buffer structure and then by a layer of glue. Only the nature of the buffer layer varies between the samples. The buffer layers studied are made from silica ($SiO_2$), silicon nitride ($Si_3N_4$) and alumina ($Al_2O_3$), and have a thickness of about 30 nm to 300 nm. The glue is an epoxide resin commonly used in encapsulation solutions using an add-on cover. It is marketed by the Epoxy Technology corporation under the reference OG146-178.

Figure 2:
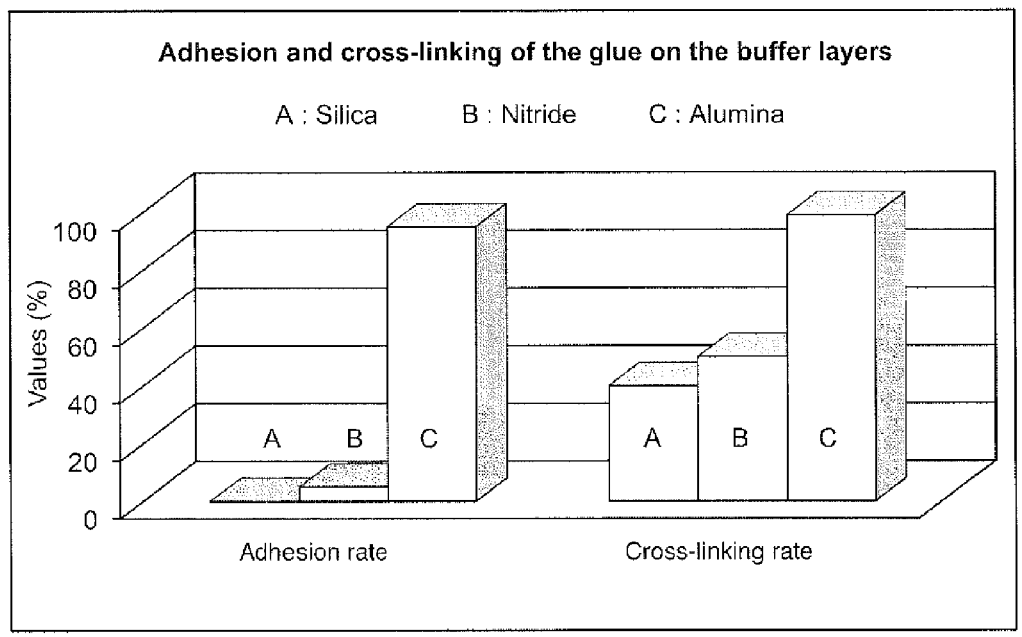
FIG. 2 is a graph showing the cross-linking and adherence rates of a layer of glue deposited above a lithium layer, with a buffer layer made from silica, silicon nitride or alumina interposed between the layer of glue and the lithium layer.

FIG. 2 represents, for comparison purposes, the adhesion and cross-linking rates of the layer of glue arranged on the above-mentioned different buffer layers.

The results show that the cross-linking rate of the OG146-178 glue is considerably better when the latter is deposited on an alumina buffer layer rather than a buffer layer made from silicon oxide or nitride. The cross-linking rate of the glue on the alumina layer is in fact close to 99%, whereas on the $SiO_2$ and $Si_3N_4$ layers, it respectively reaches 40% and 50%. Furthermore, the layer of OG146-178 glue adheres perfectly to the alumina buffer layer (adherence rate of about 95%), unlike that deposited on the silica and silicon nitride layers (0% and 5% respectively).

Similar results were obtained with a large number of buffer layers variants, in particular made from silicon oxycarbide ($SiO_xC_y$), silicon oxynitride ($SiO_xN_y$), or with multilayer systems ($SiO_2/Si_3N_4$ for example).

An alumina buffer layer therefore enables complete polymerization of the glue, unlike buffer layers with a base formed by silica and/or silicon nitride. In other words, the alumina layer is almost impermeable to the lithium ions, which are polymerization inhibiters.

Figure 3:
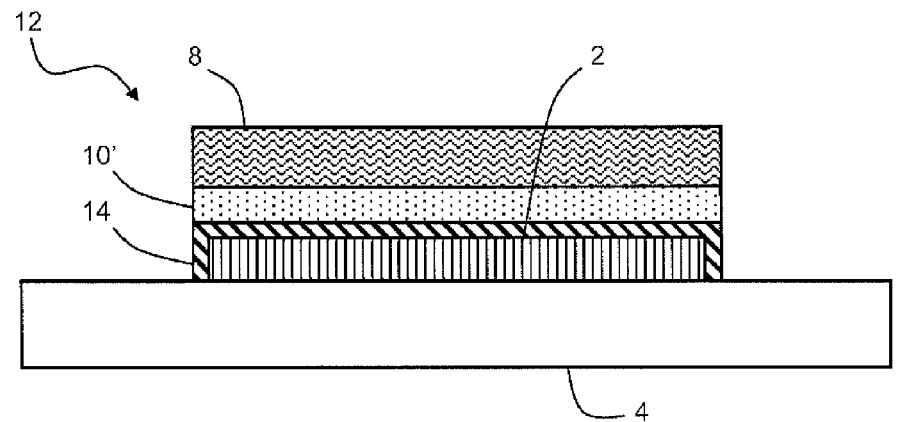
FIG. 3 represents a preferred embodiment of a lithium microbattery provided with a buffer structure according to the invention.

FIG. 3 schematically represents a lithium microbattery the size of which is reduced due to the use of a buffer structure comprising at least one alumina layer.

The microbattery conventionally comprises a stack 2 of active layers deposited on a substrate 4. The active layers of the microbattery here designate the negative and positive electrodes (anode and cathode) and the electrolyte located between the two electrodes.

The positive electrode is formed by a layer made from lithium insertion material, such as titanium oxysulfide TIOS, vanadium pentoxide $V_2O_5$ or titanium disulfide $TiS_2$. The electrolyte layer is preferably formed by lithium and phosphorus oxynitride (LiPON). Finally the anode is formed by a material containing lithium, for example pure lithium, i.e. in metallic form (Li-metal battery), or from a lithiated insertion material ($NiO_2$, SnO, Si, Ge, C . . . ) (lithium-ion battery).

The microbattery of FIG. 3 also comprises an encapsulation device 12 formed on stack 2. Encapsulation device 12 serves the purpose of protecting the active layers, and more particularly the electrode located at the top of the stack 2 opposite to the substrate 4, from oxidation.

The top electrode is in fact the active layer that is most exposed to the oxidizing species. It is also the one which in general contains the most lithium, i.e. the anode. This particular configuration of the electrodes makes the encapsulation step even more critical.

Encapsulation device 12 comprises a protective cover 8 and a layer of glue 10', made from polymer material, to fix the cover to stack 2 of active layers. It further comprises a buffer structure 14 comprising at least one alumina layer, interposed between layer of glue 10' and stack 2.

Preferably, the alumina layer of the buffer structure 14 is in contact with the layer of glue 10'.

Preferably, the buffer structure 14 is formed by the alumina layer.

The buffer structure is in contact with said stack 2. The buffer structure 14 is arranged in contact with one or more active layers containing lithium. It acts as buffer structure between layer of glue 10' and these active layers, by blocking diffusion of the lithium ions. It also enables complete cross-linking of layer of glue 10', and therefore fixing of cover 8 onto stack 2. Buffer structure 14 is furthermore chemically inert with respect to the constituents of the active layers, and to the lithium in particular.

The thickness of alumina layer is advantageously comprised between 5 nm and 50 nm. By choosing a thickness in this range, a good trade-off is obtained between the size of the encapsulation device and blocking of the lithium ions.

Cover 8 covers the top surface of stack 2. In cooperation with substrate 4, it therefore performs surface protection of the microbattery. Cover 8 can be made from glass, metal, ceramic or laminated polymer. Its thickness is preferably comprised between 50 µm and 1000 µm.

Buffer structure 14 and layer of glue 10' are advantageously arranged on the whole top surface of stack 2. Protective cover 8 is thus solidly and lastingly fixed to the stack.

In addition to its role of glue, layer 10' of polymer material absorbs the variations of volume of the microbattery during the charge and discharge cycles. During these variations of volume, alumina layer is weakly stressed (<100 MPa). It can undergo a large number of charge/discharge cycles (more than 500 cycles), without any degradation being observed.

The polymer material is preferably chosen from vinylic ethers and epoxides. As will be described further on, the thickness of layer 10' can vary between 2 µm and 20 µm, depending on the deposition technique envisaged.

Cover 8, associated with layer of glue 10' and buffer structure 14, thus forms an efficient, compact and robust encapsulation system.

To verify the encapsulation performances, ageing studies were carried out on microbatteries provided with a cover and a buffer structure 14 comprising at least an alumina layer. These microbatteries were stored for 5 months, under similar conditions of use to the conditions of use of the microbatteries. They were subjected to an oxidizing atmosphere: air at 25° C. charged with moisture. Measurements of the discharge capacity enabled a permeation rate of about $10^{-4}$ g/m$^2$/day to be calculated, i.e. the barrier level required for encapsulation of lithium microbatteries.

Buffer structure 14 also presents the advantage of being electrically insulating. It is therefore not liable to create short-circuiting between the different electrically active layers of the stack.

In this respect, it is sought to know whether the use of a buffer structure 14 comprising at least one alumina layer in contact with the active layers does not modify the electric signature of the microbattery.

Figure 4:
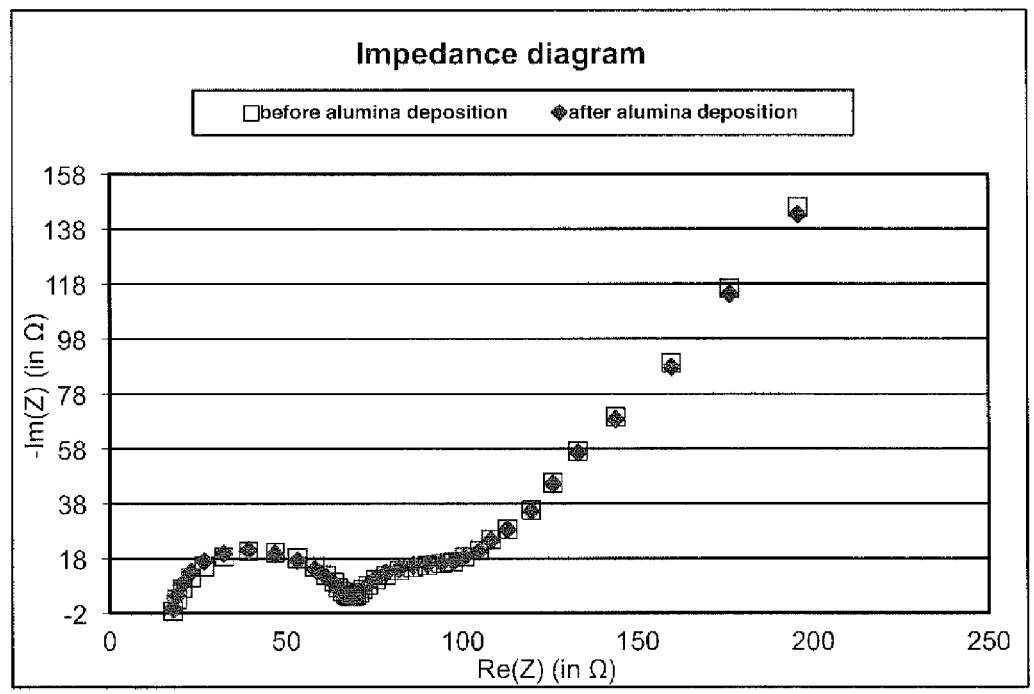
FIG. 4 is an impedance diagram of the lithium microbattery according to FIG. 3, before and after deposition of the alumina layer.

FIG. 4 represents the electric impedance diagram of the microbattery, or Nyquist diagram, before and after formation of the alumina layer. No modification of the impedance spectrum caused by the alumina layer is observed.

In the preferred embodiment of FIG. 3, at least the alumina layer of the buffer structure 14 totally covers stack 2 of active layers, i.e. the top surface and side surfaces of the stack. In addition to the lithium ions, the alumina layer is able to block the oxidizing species such as oxygen and water. The alumina layer then performs protection of the sides of the microbattery, in addition to its buffer role.

Figure 1:
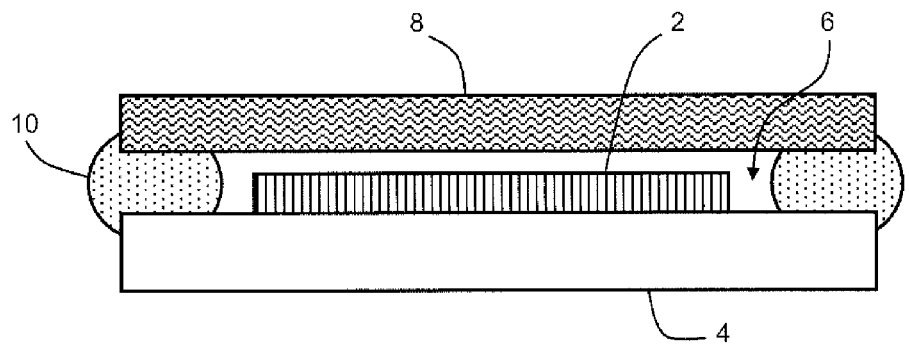
FIG. 1, described in the foregoing, is a schematic representation of a lithium microbattery according to the prior art.

In devices of the prior art, lateral protection of the microbattery is often neglected. For example, in the document US2006/0216589 (FIG. 1), the sides of the microbattery are not sufficiently protected as the glue used for sealing the cover does not constitute a barrier with the required level for encapsulation of a lithium microbattery ($10^{-4}$ g/m$^2$/day).

In the microbattery of FIG. 3, lateral protection is on the contrary satisfactory as the alumina layer has a good barrier level, higher than the required minimum level. The global barrier level of encapsulation device 12 then reaches a value of $5*10^{-5}$ g/m$^2$/day.

This protection of the sides of the microbattery is furthermore all the more advantageous the smaller the surface of the microbattery. Diffusion of the oxidizing species through the sides does in fact become as high as diffusion via the top surface, for microbatteries of small surface. It is therefore preferable to cover the lateral surfaces of the stack with the alumina layer, in the case of lithium microbatteries of small dimensions.

The alumina layer having good barrier properties, it could perform protection on the top surface of the microbattery on its own. It is however preferred to use a cover, as surface protection is in this case total. The cover is in fact impermeable to oxygen and moisture, as is the substrate.

Preferably, the top electrode, located immediately underneath the buffer structure 14 comprising at least one alumina layer, is formed solely by lithium. Microbatteries of Li-metal technology are thus privileged, the protective cover fully complies with the strong encapsulation requirements of this technology. The top electrode made from metallic lithium in fact requires optimal encapsulation which can be obtained by association of a cover and a buffer structure 14. The advantages provided by this technology can then be exploited to the full: high energy density, higher rated voltage and easier implementation than the Li-ion technology.

FIGS. 5 to 9 represent fabrication steps of a lithium microbattery provided with an encapsulation device 12 according to FIG. 3. The step of FIG. 5 corresponds to formation of the stack 2 of active layers and the steps of FIGS. 6 to 9 correspond to formation and to delineation of the encapsulation device.

Figure 5:
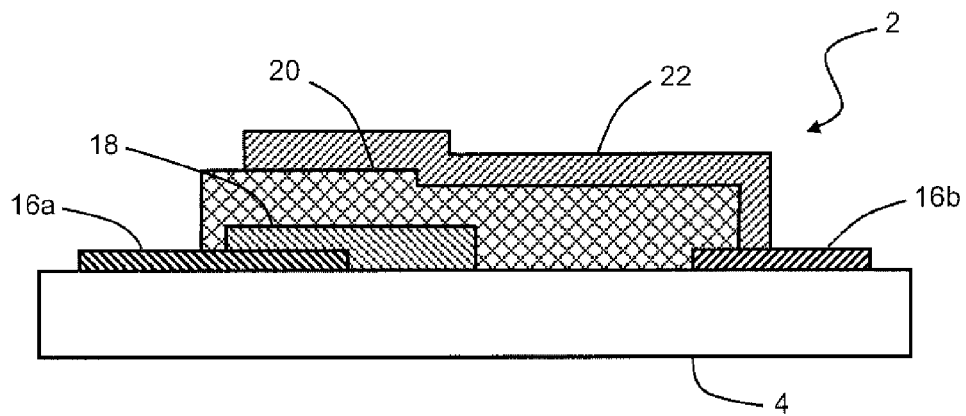
FIGS. 5 to 9 represent steps of a fabrication method of a lithium microbattery according to the invention.

FIG. 5 represents initial substrate 4 and current collectors 16a and 16b formed on a surface of substrate 4. Substrate 4, for example made from silicon, polymer or glass, has a thickness of between 100 µm and 1000 µm.

Current collectors 16a and 16b are made from an electrically conducting material, for example titanium, tungsten or gold. These collectors are deposited in the form of thin layers (about 200 nm), by Physical Vapor Deposition (PVD) for example. They are designed to form the electric terminals of the microbattery, in contact with the anode and the cathode.

Cathode 18, electrolyte 20 and anode 22 are then successively deposited on substrate 4 and metallic current collectors 16a and 16b.

Cathode 18, made from TiOS, $V_2O_5$ or $TiS_2$, is deposited on a part of cathodic collector 16a, for example by vacuum evaporation or by cathode sputtering. LiPON electrolyte layer 20 is deposited on cathode 18, and on a part of anodic collector 16b and on the area of substrate 4 separating collectors 16a and 16b. Deposition of electrolyte 20 is for example performed by cathode sputtering so as to obtain a defect-free LiPON layer. Finally, anode 22 is deposited on electrolyte layer 20 and anodic current collector 16b. Anode 22 is preferably formed from metallic lithium and deposited by vacuum evaporation.

Figure 6:
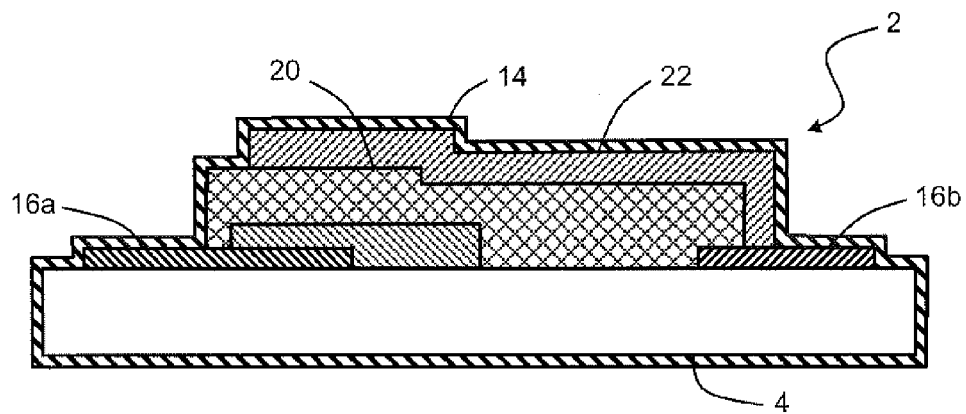

In the step of FIG. 6, a buffer structure 14 comprising at least one alumina layer, or one aluminium oxide layer, is deposited on stack 2 of active layers, and in particular the free surfaces of electrolyte 20 and anode 22.

In a preferred embodiment, alumina layer is obtained by Atomic Layer Deposition (ALD), Deposition of the alumina by ALD procures numerous advantages in comparison with other thin layer deposition techniques of CVD (Chemical Vapor Deposition) or PVD (Physical Vapor Deposition) type. This technique in particular makes it possible to obtain a conformal deposition, i.e. an appreciably constant thickness (variation of the thickness of less than 1%). The active layers of lithium are then covered in homogenous manner. An alumina layer deposited by ALD is moreover dense, which enhances blocking of the lithium ions.

As represented in FIG. 6, at least the alumina layer of the buffer structure 14, deposited by ALD, covers the whole of substrate 4 and of stack 2, i.e. collectors 16a, 16b, electrolyte 20 and anode 22.

The operating mode described above enables a buffer structure 14 comprising at least one alumina layer to be obtained having excellent barrier properties both for blocking the lithium and for blocking its oxidizing species.

In this embodiment, ALD deposition is performed from a first organometallic precursor containing aluminium, such as trimethyl-aluminium (TMA), and a second precursor containing water, for example deionized water. The deposition temperature is preferably chosen between 80° C. and 150° C., i.e. a much lower temperature than the melting temperature of lithium (about 180° C.).

It is known that the reaction of water with the lithium of the active layers is detrimental for operation of the microbattery, which is why it is desired to protect it with an encapsulation device. Water is a major oxidant of lithium and its use as precursor in the ALD process consequently appears to be inopportune. It has however surprisingly been observed that the water-based precursor does not cause any oxidation of the active layers during the ALD process. Lithium microbatteries fabricated according to this operating mode do not present any damage and are electrically functional.

The two precursors are advantageously introduced in sequential and cyclic manner, starting by the TMA. On the one hand this enables the molecules of each precursor to occupy the vacant sites to form an atomic layer, before the next precursor is introduced. On the other hand this leaves the possibility of removing the molecules which have not reacted, as well as the reaction products. Each introduction period of a precursor is thus advantageously followed by a purge period before the next precursor is introduced. In other words, ALD is performed by a succession of cycles the number of which depends on the thickness of the alumina layer. Each cycle comprises:

an introduction period of the TMA, for example of 40 seconds;

a purge period, for example also of 40 seconds;

a deionized water introduction period (e.g. 40 s); and a purge period (e.g. 40 s).

The thickness of the alumina layer can be controlled by adjusting the number of cycles. The optimal thickness of the alumina layer is about 50 nm, which corresponds for example to about 500 cycles of 4 times 40 s. The optimal deposition temperature is about 80° C. The alumina layer obtained under these preferential conditions presents the best barrier performances and the underlying active layers of lithium are not impacted.

After depositing the buffer structure 14 comprising at least one alumina layer on the stack 2 of active layers 18, 20, 22 containing lithium (FIG. 6), the stack 2 of active layers and the buffer structure 14 are covered by a protective cover 8.

A layer of polymerizable material 10' is disposed between the buffer structure 14 and the protective cover 8. The layer of polymerizable material 10' is configured so as to form a layer of glue.

Figure 7:
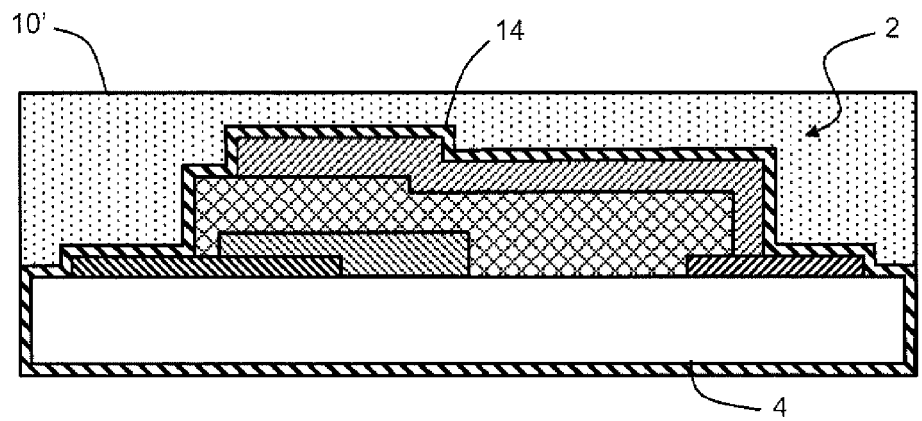

The layer of polymerizable material 10' can be deposited on the buffer structure 14 prior to fitting of the protective cover 8. This step is represented in FIG. 7.

According to another embodiment, the layer of polymerizable material 10' can be deposited on the protective cover 8 prior to fixing of the protective cover 8 with the layer of polymerizable material 10' on the buffer structure 14.

The layer of glue 10' is, advantageously, deposited on the buffer structure 14. It is preferably deposited full wafer, i.e. on the whole surface of stack 2 and of substrate 4. Unlike alumina layer 14, the thickness of layer 10' is not constant. Layer 10' does in fact compensate the height variations due to stack 2 so as to obtain a substantially flat top surface ideal for subsequent fitting of the add-on cover.

The glue used to secure the cover on the stack is formed by a polymerizable material. What is meant by polymerizable material is a solution comprising monomers (or prepolymers) and at least one polymerization initiator, preferably of cationic type. Monomers having a base formed by vinylic ethers or heterocyclic monomers (epoxides, lactones, cyclic ethers, epoxysilicones . . . ) can be used. Epoxide monomers and vinylic ethers being particularly reactive, they will be preferred so as to obtain quick polymerization.

Certain products available on the market, commonly called photo-polymerizable or thermosetting resins, comprise these monomers, in particular those marketed by Epoxy Technology under the denomination "OG" (OG146-178, UVO-114, OG115, OG114-4, OG146) and under the denomination "Epo-Tek" (Epo-Tek-330, Epo-Tek-360). The products of the "OG" series are cross-linked by UV rays whereas the products of the "Epo-Tek" series are cross-linked by thermal means.

Advantageously, the polymerizable material has a viscosity lower than 1000 cPs (centipoise). Layer 10' thus follows the shapes of stack 2 perfectly.

The layer of polymerizable material 10' is preferably deposited on the whole of a substrate by spin coating. This technique is easy to implement, well suited to polymer materials and further enables the thickness of the polymer layer to be controlled simply.

The thickness of layer 10' is preferably comprised between 2 μm and 20 μm according to the speed and duration of rotation of the spin coater. For example purposes, a layer 10' of OG146-178 resin with a thickness of 10 μm is obtained by spin coating at a speed of 1200 rpm for 40 s.

Figure 8:
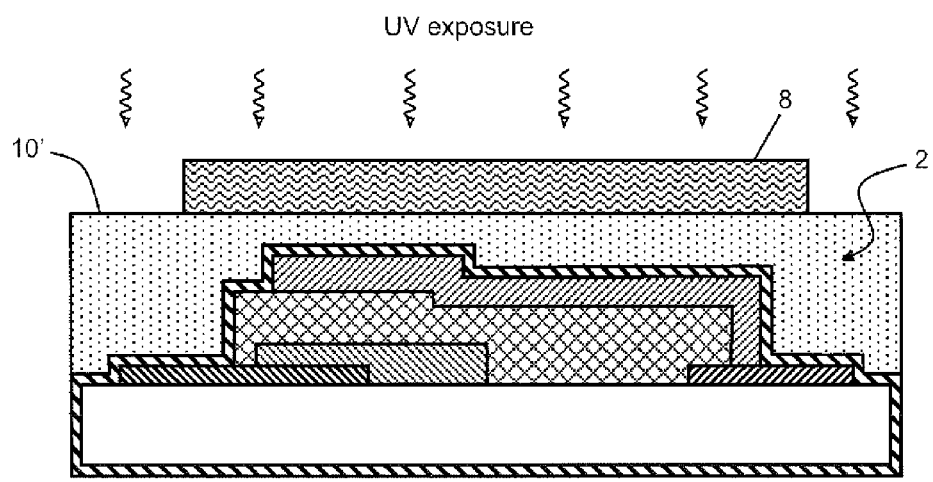

In FIG. 8, cover 8 is positioned on layer 10' of polymerizable material, facing stack 2 of active layers. Cover 8 is preferably resting totally on layer 10'. Polymerizable material 10' is then cross-linked, thermally or by ultraviolet rays (300-500 nm) in the case of a transparent cover, made from glass for example. Exposure to the UV rays or to the thermal treatment enables hardening of the resin and fixing of cover 8 on stack 2.

Cross-linking of the thermosensitive polymers is preferably performed at a temperature comprised between 80° C. and 150° C. to avoid damaging the lithium layers and cross-linking of the photosensitive polymers is performed by exposure to ultraviolet rays with a power density of 100 mW/cm$^2$ for a duration of less than 10 mn. For example, in FIG. 8, the layer of OG146-178 resin with a thickness of 10 μm is hardened after 5 min of UV exposure through cover 8.

Cross-linking of the polymerizable material enables to stick the cover 8 to the stack 2 of active layers via the buffer structure 14.

Figure 9:
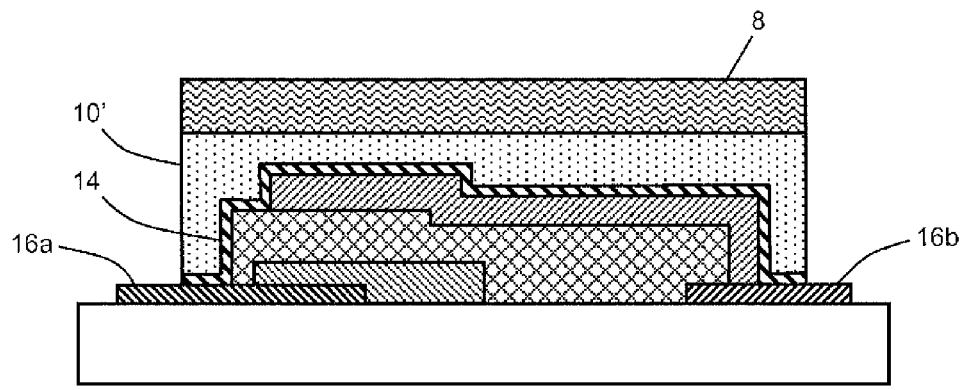

Finally, the step of FIG. 9 consists in successively etching the hardened polymer layer 10' and alumina layer 14 on the edges of the microbattery in order to release a part of collectors 16a and 16b.

Layer 10' is advantageously etched in anisotropic and selective manner using cover 8 as etching mask. This etching is preferably implemented by an oxygen ($O_2$) plasma or a gaseous mixture of oxygen ($O_2$) and fluorinated gas ($SF_6$). In the case of the OG146-178 resin with a thickness of 10 μm, layer 10' is for example etched up to alumina layer 14 after application of an $O_2$ plasma (90 sccm)/$SF_6$ (10 sccm) at a power of 100 W for 10 mn.

Alumina layer 14 can be fabricated by dry or wet processes. The wet etching solutions typically use a hydrofluoric acid (HF) base. A mixture of nitric acid, phosphoric acid and acetic acid ($HNO_3$/$H_3PO_4$/$CH_3COOH$) can also be used. Etching of an alumina layer with a thickness of 50 nm is for example performed by immersing the substrate in a HF bath for 2 min or in a mixture of $HNO_3$ (1-5%)/$H_3PO_4$ (65-75%)/$CH_3COOH$ (5-10%) diluted in water for 12 min. The dry etching solutions consist of a chlorinated plasma, for example $BCl_2$, $CCl_4$, $CHCl_3$ or $SiCl_4$.

Numerous variants and modifications of the lithium microbattery and of its fabrication method will be apparent to the person skilled in the art. In particular, sticking of cover 8 can be performed at the level of the lateral surfaces of stack 2 rather than on the top surface. A bead of glue with a height of less than 100 μm can be formed around the component, for example by means of a syringe with controlled flowrate and opening. Unlike the prior art, the bead of glue will be arranged in contact with the stack of active layers, the sides of the stack having previously been covered by the alumina layer.

This arrangement enables the thickness of the microbattery to be reduced by a few micrometers for certain applications in which the integration requirements are stringent. Encapsulation of the microbattery is however optimized as the cover and alumina layer respectively perform the surface protection and protection of the sides of the microbattery.

The invention claimed is:

1. A lithium microbattery comprising successively:
    a substrate;
    a stack of active layers containing lithium, the stack of active layers being deposited onto the substrate;
    a buffer structure comprising at least one alumina layer, the buffer structure being in contact with the stack of active layers;
    a layer of glue in contact with the buffer structure, wherein the layer of glue includes a polymerizable material; and
    a protective cover provided over the stack of active layers, the protective cover being fixed to the buffer structure by the layer of glue.

2. The microbattery according to claim 1, wherein the alumina layer of the buffer structure is in contact with the layer of glue.

3. The microbattery according to claim 1, wherein at least the alumina layer of the buffer structure completely covers the stack of active layers.

4. The microbattery according to claim 1, wherein the stack of active layers comprises a metallic lithium electrode in contact with the buffer structure.

5. The microbattery according to claim 1, wherein the alumina layer has a thickness comprised between 5 nm and 50 nm.

6. A fabrication method of a lithium microbattery, comprising the following steps:
    providing a stack of active layers containing lithium;
    depositing a buffer structure comprising at least one alumina layer on the stack of active layers;
    providing a protective cover over the stack of active layers and the buffer structure, a layer of polymerizable material being disposed between the buffer structure and the protective cover; and
    cross-linking the polymerizable material to stick the protective cover to the stack of active layers via the buffer structure.

7. The method according to claim 6, wherein the layer of polymerizable material is deposited either on the buffer structure prior to fitting of the protective cover or on the protective cover prior to fixing of the protective cover with the layer of polymerizable material on the buffer structure.

8. The method according to claim 6, wherein the alumina layer is obtained by atomic layer deposition.

9. The method according to claim 8, wherein the atomic layer deposition is performed from a first precursor containing aluminium and a second precursor containing water.

10. The method according to claim 9, wherein the first and second precursors are used in successive manner starting with the first precursor.

11. The method according to claim 8, wherein atomic layer deposition is performed at a temperature comprised between 80° C. and 150° C.

12. The microbattery according to claim 1, wherein the buffer structure consists of a single alumina layer.

13. The microbattery according to claim 1, wherein the buffer structure is in contact with a top surface and each side surface of the stack of active layers.

14. The microbattery according to claim 1, wherein the polymerizable material comprises a cross-linkable polymer.

15. The microbattery according to claim 1, wherein the polymerizable material comprises an epoxy resin.

16. The microbattery according to claim 1, wherein the protective cover is in contact with the layer of glue.

* * * * *